(12) United States Patent
Matsui

(10) Patent No.: US 6,758,900 B1
(45) Date of Patent: Jul. 6, 2004

(54) MICRO THREE-DIMENSIONAL STRUCTURE, PRODUCTION METHOD THEREFOR AND PRODUCTION DEVICE THEREFOR

(75) Inventor: Shinji Matsui, Hyogo (JP)

(73) Assignee: NEC Corporation, Tokyo (JP)

( * ) Notice: Subject to any disclaimer, the term of this patent is extended or adjusted under 35 U.S.C. 154(b) by 91 days.

(21) Appl. No.: 10/089,656

(22) PCT Filed: Aug. 17, 2000

(86) PCT No.: PCT/JP00/05499

§ 371 (c)(1),
(2), (4) Date: Aug. 22, 2002

(87) PCT Pub. No.: WO01/25504

PCT Pub. Date: Apr. 12, 2001

(30) Foreign Application Priority Data

Oct. 7, 1999 (JP) .......................................... 11/286337

(51) Int. Cl.[7] .............................................. C03B 23/08

(52) U.S. Cl. ............................. 117/89; 117/90; 117/91; 117/92; 117/101; 117/106; 117/108; 117/923

(58) Field of Search ............................. 117/89, 90, 91, 117/92, 101, 103, 106, 108, 923

(56) References Cited

U.S. PATENT DOCUMENTS

| 5,677,011 A | * | 10/1997 | Hatakeyama et al. | ....... 427/497 |
| 5,746,826 A | * | 5/1998 | Hasegawa et al. | ............ 117/90 |
| 5,837,454 A | * | 11/1998 | Cozzette et al. | ............... 435/6 |
| 6,190,511 B1 | * | 2/2001 | Wei | ........................ 204/192.11 |

* cited by examiner

Primary Examiner—Robert Kunemund
(74) Attorney, Agent, or Firm—Sughrue Mion, PLLC

(57) ABSTRACT

A micro three-dimensional structure capable of producing a micro three-dimensional structure (micrometer-to nanometer-order outer shape) having a complicated structure, a production method therefor and production device therefor are provided. In the production method for the micro three-dimensional structure, performed are the step of irradiating a focused ion beam (4) to a sample (1) while supplying a material gas (3) to form a first-layer deposit (5), the step of releasing secondary electrons (6) from the first-layer deposit (5) hit by ions to allow the secondary electrons (6) to form a terrace (7) on the first-layer deposit (5), a step of deflecting the focused ion beam (4) in a desired direction of the terrace (7) based on a set amount from a focal position controlling apparatus, a step of forming a second-layer deposit (8) in a deflected position on the terrace (7) based on the deflection amount, and a step of repeating the above steps to form a set micro three-dimensional structure.

14 Claims, 6 Drawing Sheets

MICRO THREE-DIMENSIONAL STRUCTURE, PRODUCTION METHOD THEREFOR AND PRODUCTION DEVICE THEREFOR

TECHNICAL FIELD

The present invention relates to a micro three-dimensional structure, the outer shape of which is on the order of several micrometers to nanometers, and produced using a CVD method, particularly, a focused ion beam method, a production method therefor, and a production device therefor.

BACKGROUND ART

Products of micro three-dimensional structure include, for example, a gear, a bellows, a coil, a drill, a knife, and the like which are used as micromachines. They can be applied as well to a DNA handling miniature tool, a micro engine, a micro shutter, and a probe for a scanning probe microscope.

On the other hand, the micro three-dimensional structure is also related to the field of direct draw three-dimensional lithography which is now under investigation for purposes of higher integration of semiconductor devices.

CVD based methods of producing a micro three-dimensional structure are classified into three which use light (laser), a focused electron beam, and a focused ion beam, respectively. In the lithography, production of deflection grating, and the like, a three-dimensional structure is made of a vertical deposit which is mainly perpendicular to a substrate.

DISCLOSURE OF THE INVENTION

However, the photo-assisted CVD has limitations in the production of three-dimensional nano-structures due to a restriction of the width of a beam forced thereto in dependence on the wavelength, and must incline a stage for three-dimensionally bending the beam in the horizontal direction.

On the other hand, the focused electron beam, similar to the focused ion beam, provides a beam diameter of several nanometers, so that it is suitable for the production of micro structures. In addition, since both beams can be deflected through an electric field and a magnetic field, a stage need not be inclined for producing a three-dimensional structure. However, since electrons have a problem due to its light mass as compared with ions that the electrons travel over a wide range and therefore penetrate a deposited three-dimensional product and the electrons reach a substrate, thereby causing deposits at unwanted locations.

In view of the foregoing situation, it is an object of the present invention to provide a micro three-dimensional structure capable of producing a micro three-dimensional structure (micrometer- to nanometer-order outer shape) having a complicated structure, a production method therefor and production device therefor.

The present invention achieves the above object by:

[1] a method of producing a micro three-dimensional structure, characterized by comprising the steps of: (a) irradiating a focused ion beam to a sample while supplying a material gas to form a deposit; (b) releasing secondary electrons from the deposit hit by ions to allow the secondary electrons to form a terrace on the deposit; (c) deflecting the focused ion beam in a desired direction of the terrace based on a set amount from a focal position controlling apparatus; (d) forming an overlying deposit at a displaced position on the terrace based on the deflection amount; and (e) repeating the steps (b) to (d) in sequence to form a set micro three-dimensional structure.

[2] A method of producing a micro three-dimensional structure described in [1] is characterized in that a beam source is $Ga^+$, $Si^+$, $Si^{++}$, $Be^+$, $Be^{++}$, $Au^+$, or $Au^{++}$ as liquid metal ions, or $H^+$ or $He^+$ as a gas ion source;

[3] A method of producing a micro three-dimensional structure described in [1] is characterized in that the material gas is $WF_6$, $W(CO)_6$, $Mo(CO)_6$, $Fe(CO)_5$, $Ni(CO)_4$, $Au(CH_3)_2(AcAc)$, $Cu(HFAcAc)_2$, or $Al(CH_3)_2$ as an organometallic gas.

[4] A method of producing a micro three-dimensional structure described in [1] is characterized in that the material gas is pyrene ($C_{16}H_{10}$), styrene ($C_8H_8$), HMDS, or HMCTS as an organic gas.

[5] A device for manufacturing a micro three-dimensional structure is characterized by comprising a sample carried on a temperature variable sample stage, a focused ion beam source, a gas supply device, and a focal position controlling apparatus for a focused ion beam, and forming a deposit on the sample by focused ion beam assisted CVD, forming a terrace on the deposit, deflecting a focused ion beam in a desired direction of the terrace based on a set amount sequentially from the focal position controlling apparatus to form an overlying deposit, and forming a set micro three-dimensional structure.

[6] A micro three-dimensional structure obtained by the method of producing a micro three-dimensional structure described in [1] is a coil having an outer shape on the order of several micrometers to nanometers.

[7] A micro three-dimensional structure described in [6] is characterized in that the micro three-dimensional structure is a micro coil having a diameter of 0.6 μm and a wire diameter of 0.08 μm.

[8] A micro three-dimensional structure obtained by the method of producing a micro three-dimensional structure described in [1] is a bellows having an outer shape on the order of several micrometers to nanometers.

[9] A micro three-dimensional structure described in [8] is characterized in that the micro three-dimensional structure is a micro bellows having an outer diameter of 2.75 μm, a height of 6.1 μm, and a thickness of 0.1 μm or more.

[10] A micro three-dimensional structure obtained by the method of producing a micro three-dimensional structure described in [1] is a drill having an outer shape on the order of several micrometers to nanometers.

[11] A micro three-dimensional structure described in [10] is characterized in that the micro three-dimensional structure is a micro drill having an outer diameter of 0.1 μm.

[12] A micro three-dimensional structure obtained by the method of producing a micro three-dimensional structure described in [1] is a wine glass having an outer shape on the order of several micrometers.

[13] A micro three-dimensional structure described in [12] is characterized in that the micro three-dimensional structure is a micro wine glass having an outer diameter of 2.75 μm and a height of approximately 12 μm.

[14] A micro three-dimensional structure obtained by the method of producing a micro three-dimensional structure described in [1] comprises diamond-like carbons made by a $Ga^+$ focused ion beam at an accelerating voltage of 30 kV using pyrene ($C_{16}H_{10}$) as an organic gas.

BEST MODE FOR CARRYING OUT THE INVENTION

In the following, an embodiment of the present invention will be described in detail.

FIG. 1 is a diagram generally illustrating the principles of production steps for a micro three-dimensional structure according to an embodiment of the present invention.

Figure 1A:
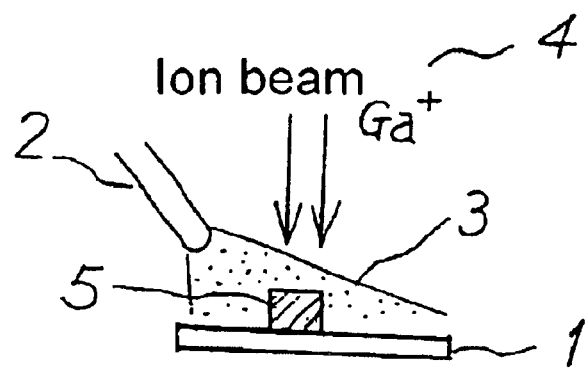
FIG. 1 is a diagram generally illustrating the principles of production steps for a micro three-dimensional structure according to an embodiment of the present invention.

(1) First, as illustrated in FIG. 1(a), a focused ion beam 4 is irradiated while a material gas 3 is supplied onto a sample (substrate) 1 from a nozzle 2. In other words, focused ion beam assisted CVD is applied to form first layer deposit 5.

Figure 1B:
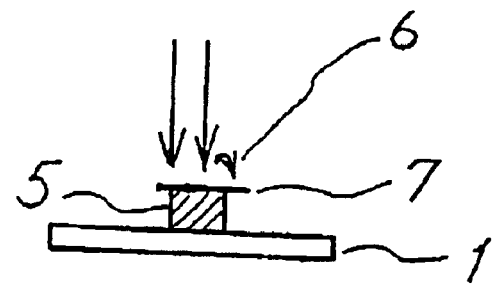

(2) Subsequently, as illustrated in FIG. 1(b), ions impinge on first layer deposit 5 to release secondary electrons 6, and terrace 7 is formed of secondary electrons 6.

Figure 1C:
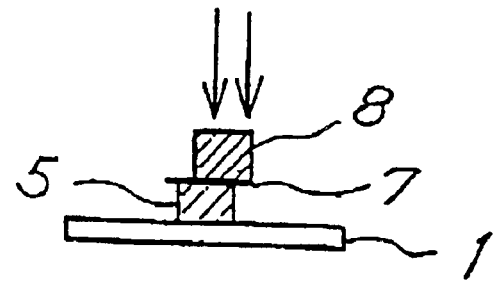

(3) Next, as illustrated in FIG. 1(c), focused ion beam 4 is deflected in a desired direction of terrace 7. As a result, second layer deposit 8 can be formed at a position on terrace 7 displaced by the deflected amount.

Figure 2:
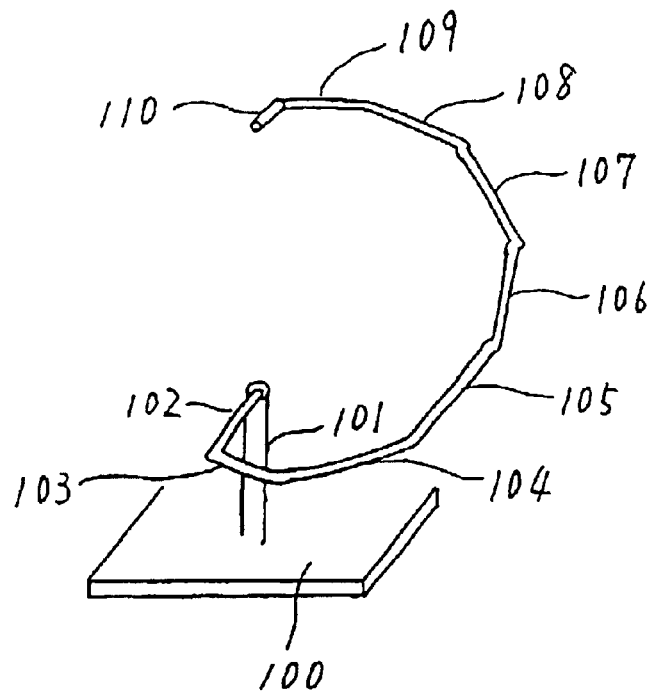
FIG. 2 is a diagram illustrating an exemplary micro three-dimensional structure produced in the space based on the principles of producing an FIB-assisted CVD micro three-dimensional structure.

A process for producing a micro three-dimensional structure actually produced using the principle diagram for the production of the micro three-dimensional structure, described in connection with FIG. 1, will be discussed with reference to FIG. 2.

(1) First, pyrene ($C_{16}H_{10}$) is supplied onto silicon substrate 100, on which a deposit is to be formed, as a carbon (C) source from a nozzle, while $Ga^+$ FIB is irradiated perpendicularly to the silicon substrate 100 at an accelerating voltage of 30 kV, to form carbon column 101 (having a diameter of 0.08 $\mu$m) perpendicularly to silicon substrate 100.

(2) Subsequently, based on the principles illustrated in FIG. 1, an ion beam is slightly displaced on carbon column 101 to form a terrace on the order of several tens of nanometers in an ion beam scanning direction by spread of secondary electrons generated by the ion irradiation and having energy of several electron-volts. After the terrace has been fully formed, the beam is scanned over a range within the spread of the secondary electrons (within several tens of nanometers). As a terrace has been fully formed after the beam was moved, the beam is again scanned over a range within the spread of the secondary electrons.

By repeating these steps, a micro three-dimensional structure formed of carbon column 102, and continuous carbon columns 103, 104, 105, 106, 107, 108, 109 and 110, sequentially in the space by further movements of the beam, can be produced corresponding to the movements of the ion beam.

In the following, the foregoing will be explained in detail.

Figure 3:
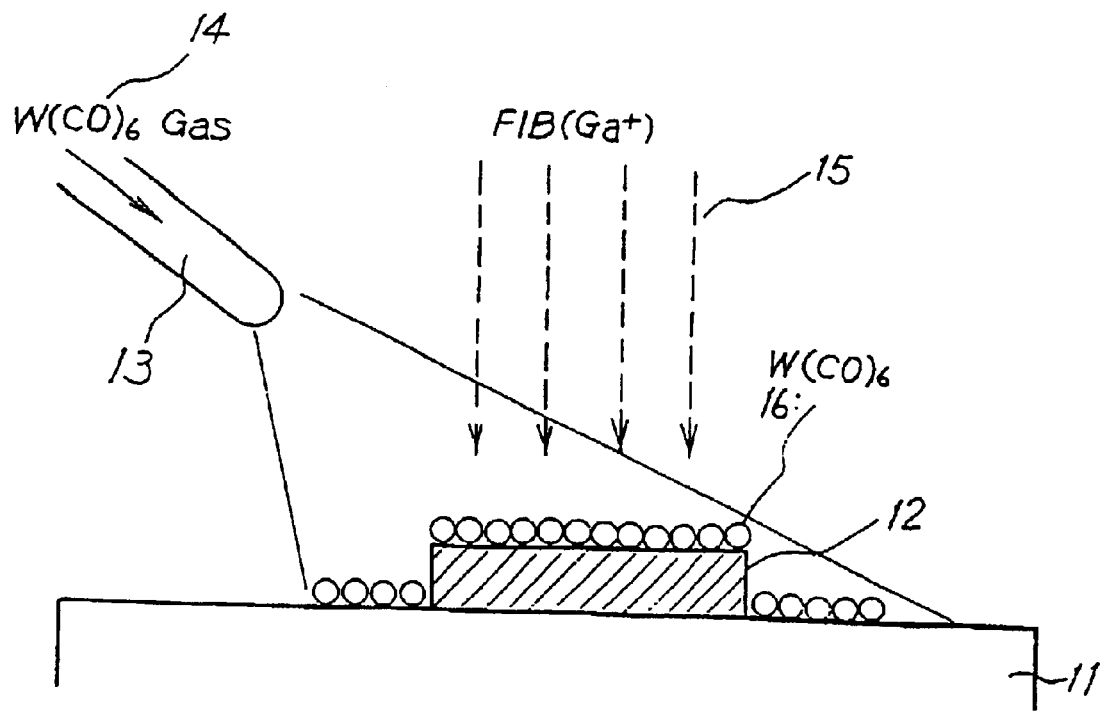
FIG. 3 is a diagram for explaining the principles of a focused ion beam assisted CVD (maskless deposition) method according to the present invention.

FIG. 3 is a diagram for explaining the principles of a focused ion beam assisted CVD (maskless deposition) method according to the present invention.

In this figure, after W film 12 is deposited on sample 11, W film 12 undergoes the focused ion beam assisted CVD. For example, W film 12 is irradiated with focused ion beam ($Ga^+$) 15 while W(CO)$_6$ gas 14 is supplied from nozzle 13 as an organic metal gas.

Then, focused ion beam ($Ga^+$) 15 acts on W(CO)$_6$ gas 14 to produce W+6CO↑. For reference, numeral 16 designates a W(CO)$_6$ molecule, and the W film applied with the focused ion beam assisted CVD has a conductivity of 100 to 200 $\mu\Omega$.cm.

Now, description will be made on an embodiment of the focused ion beam assisted CVD in the present invention.

(A) Used as a beam source is a liquid metal ion ($Ga^+$, $Si^+$, $Si^{++}$, $Be^+$, $Be^{++}$, $Au^+$, $Au^{++}$, or the like), or a gas ion source ($H^+$, $He^+$, or the like).

(B) Used as a material gas is an organometallic gas [$WF_6$, $W(CO)_6$, $Mo(CO)_6$, $Fe(CO)_5$, $Ni(CO)_4$, $Au(CH_3)_2(AcAc)$, $Cu(HFAcAc)_2$, $Al(CH_3)_2$, or the like], or an organic gas [pyrene ($C_{16}H_{10}$), styrene ($C_8H_{10}$), HMDS, HMCTS, or the like].

(C) A minimum beam diameter is 5 to 10 nm.

(D) The following features are provided:

(1) The minimum beam diameter is small, so that it is advantageous in the production of a super micro three-dimensional structure.

(2) Since the direction can be controlled with an electric field and a magnetic field, a free three-dimensional structure can be produced only through manipulations of the beam.

(3) The mass is heavy as compared with electrons.

(4) The traveling range is small. For example, it is 50 nm or less with 30 kV, $Ga_+$, $Si_+$.

(5) A local limitation can be achieved so that a deposit can be formed only at a desired location.

Thus, (a) an ion beam, for example, $Ga_+$ reaches a substrate, and a deposit is gradually formed by a surface reaction with an organometallic gas. The growth in the vertical direction gradually moves a focal point of the beam upward;

(b) the ion beam impinges to release secondary electrons which form a terrace at leading ends of the deposit; and (c) the beam is slightly shifted on the terrace to incur the next growth.

While the electron assisted CVD has a problem that electrons penetrate the terrace and reach unwanted locations at which unwanted deposits are formed, the ion beam assisted CVD is free from the formation of such unwanted deposits because the ions travel over an order-of-magnitude short range as compared with electrons, so that a good micro three-dimensional structure can be produced.

While the production is performed in the order described above, the beam is controlled using a computer. In other words, a computer system is built for controlling the beam.

Figure 4:
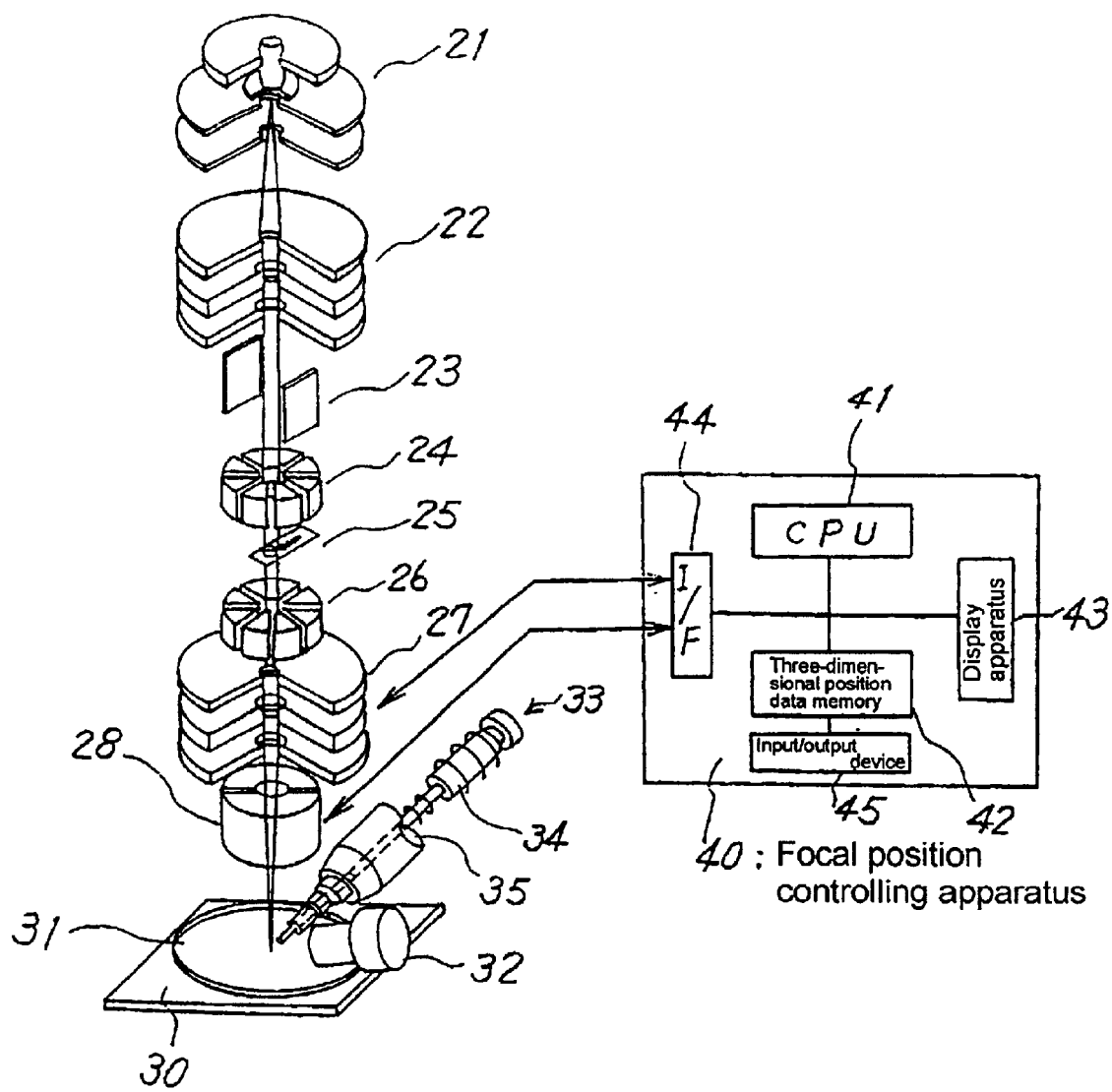
FIG. 4 is a system configuration diagram for a micro three-dimensional structure production device according to the present invention.

FIG. 4 is a system configuration diagram for a micro three-dimensional structure production device according to the present invention.

In this figure, reference numeral 21 designates a Ga liquid metal ion source; 22 a condenser lens; 23 a beam blanker; 24 an aligner; 25 a variable diaphragm; 26 a sting meter/aligner; 27 an objective lens; 28 a scanning electrode; 30 a sample stage; 31 a sample; 33 a secondary charged particle detector; and 33 a gas supply device. This gas supply device 33 has reserver 34, heater 35 and the like. This configuration is similar to an FIB based maskless deposition device for use in the processing of LSI. A control system for each component is omitted.

As illustrated in this figure, in the present invention, ion beam focal position controlling apparatus 40 is connected to objective lens 27 and scanning electrode 28 to control a fine focal position. Focal position controlling apparatus 40 has CPU (central processing unit) 41; three-dimensional position data memory 42 for producing a micro three-dimensional structure; display device 43; input/output interface 44, and input/output device 45.

Here, Ga-based liquid metal ion source 21 is generally used Ga with an accelerating voltage of 30 kV. A beam current is required to be as high as approximately 10 pA. Gas supply device 33 required for deposition is also provided to supply reserver 34 with pyrene ($C_{16}H_{10}$) as a raw material, and reserver 34 and gas passage are heated by heater 35 for sublimation.

In the following, description will be made on a specific examples of micro three-dimensional structures.

The following micro three-dimensional structures were produced on a trial basis using a mainly C-based gas as an organic gas and monovalent Ga ions as metal ions. In these examples, it is confirmed by a Raman spectroscopy that films produced by CVD using pyrene ($C_{16}H_{10}$) as an organic gas, and $Ga^+$ FIB with an accelerating voltage of 30 kV are diamond-like carbons.

Figure 5:
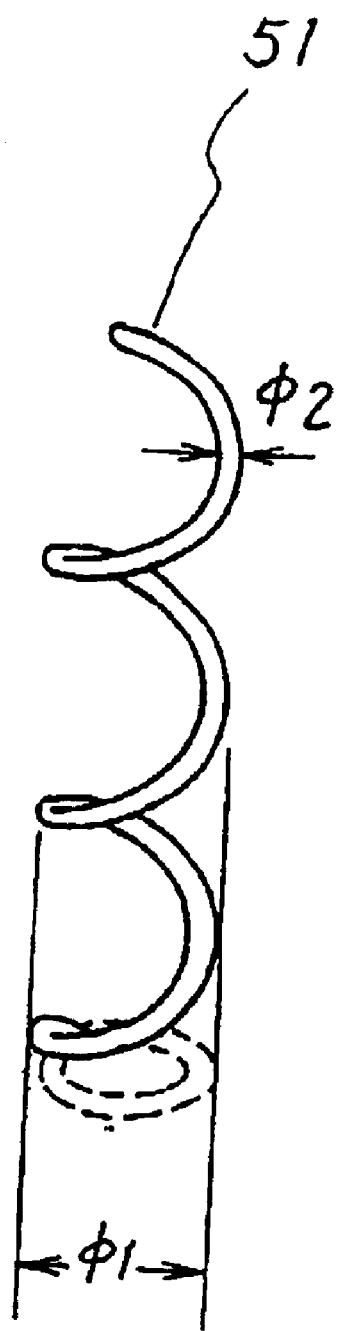
FIG. 5 is an explanatory diagram for a micro three-dimensional structure illustrating a first example of the present invention.

FIG. 5 is an explanatory diagram of a micro three-dimensional structure illustrating a first example of the present invention.

In this example, a coil 51 having a diameter $\phi_1$ of 0.6 μm and a wire diameter $\phi_2$ of 0.08 μm could be produced in three turns for two minutes (at a period of 40 seconds) using a mainly C-based gas as an organic gas, and monovalent Ga ions as metal ions. The carbon micro coil thus produced can be utilized as a device effective in the absorption of electromagnetic waves which cause malfunctions of medical equipment and the like.

Figure 6:
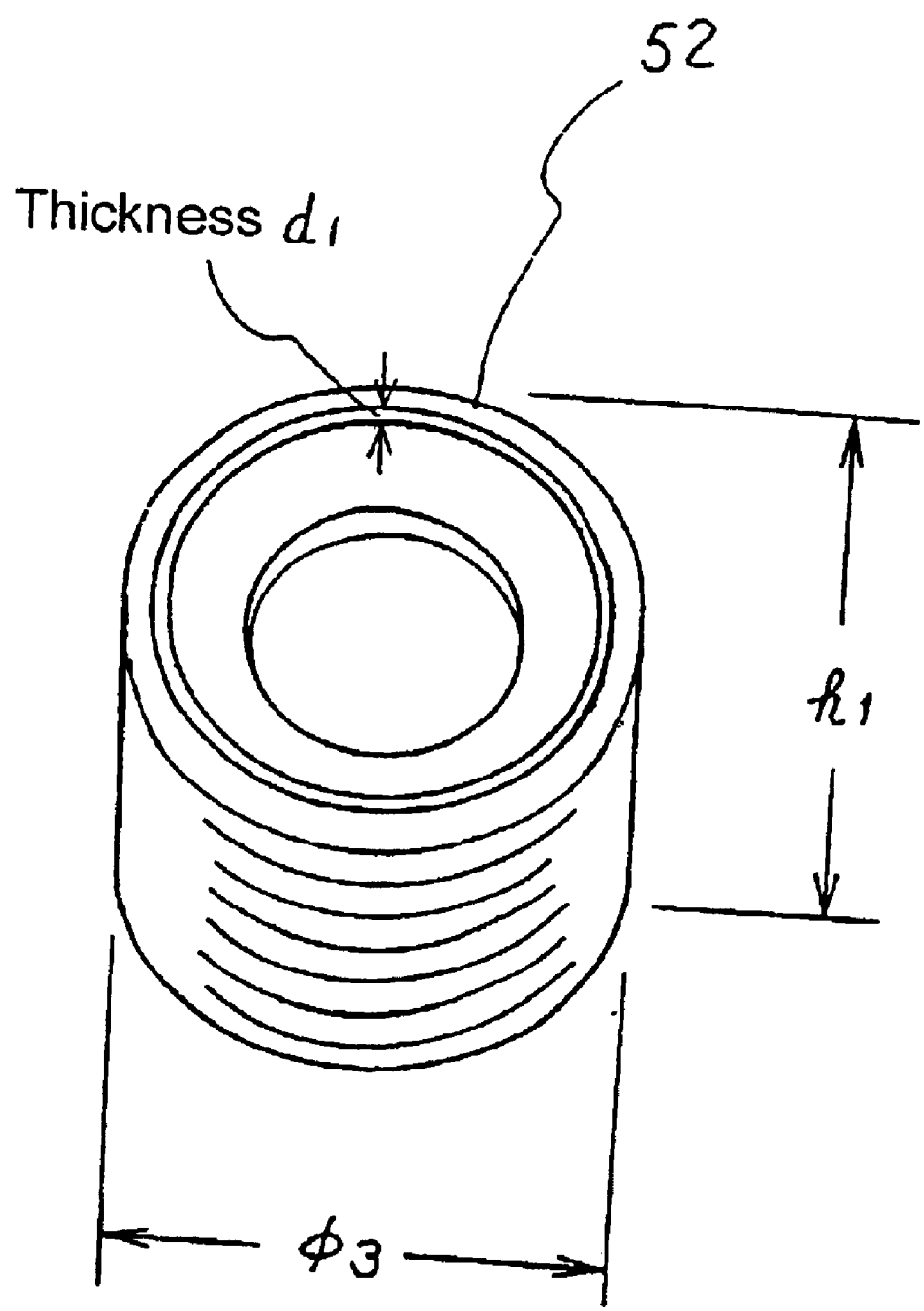
FIG. 6 is an explanatory diagram for a micro three-dimensional structure illustrating a second example of the present invention.

FIG. 6 is an explanatory diagram for a micro three-dimensional structure illustrating a second example of the present invention.

In this example, micro bellows 52 having an outer diameter $\phi_3$ of 2.75 μm, a height $h_1$ of 6.1 μm, and a thickness $d_1$ of 0.1 μm or more could be produced using $Ga^+$ FIB with an accelerating voltage of 30 kV, and a beam current of 16 pA for 300 seconds. The micro bellows thus produced is essential for fitting when a micro system is built.

Figure 7:
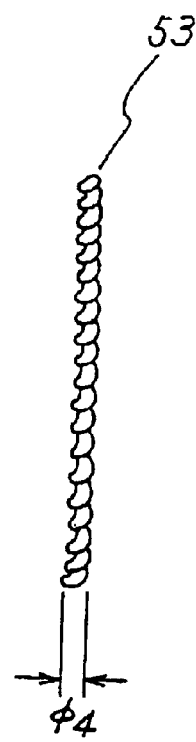
FIG. 7 is an explanatory diagram for a micro three-dimensional structure illustrating a third example of the present invention.

FIG. 7 is an explanatory diagram for a micro three-dimensional structure illustrating a third example of the present invention.

In this example, a drill 53 having an outer diameter $\phi_4$ of 0.1 μm could be produced using a mainly W-based gas as an organic gas and monovalent Ga ions as metal ions. By mounting the micro drill thus produced at the tip of a micro motor, micro holes can be formed. For example, a hole smaller than a red blood cell can be formed through a blood vessel, thereby making it possible to prevent hemorrhage when a medicine is injected.

Figure 8:
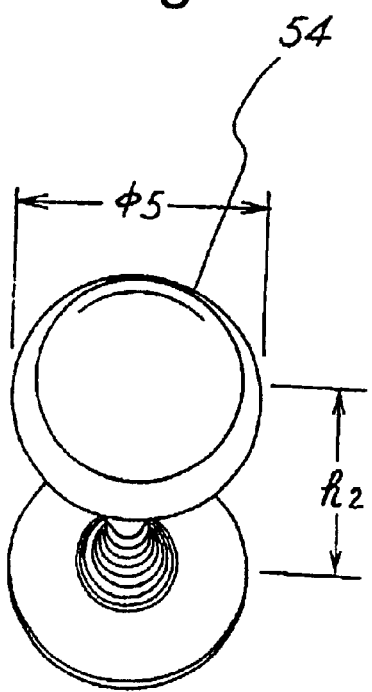
FIG. 8 is an explanatory diagram for a micro three-dimensional structure illustrating a fourth example of the present invention.

FIG. 8 is an explanatory diagram for a micro three-dimensional structure illustrating a fourth example of the present invention.

In this example, a micro wine glass 54 having an outer diameter $\phi_5$ of 2.75 μm and a height $h_2$ of 12 μm could be produced using $Ga^+$ FIB with an accelerating voltage of 30 kV, and a beam current of 16 pA for 600 seconds.

The present invention is not limited to the foregoing examples, but can be modified in various manners based on the gist of the present invention, and such modifications should not be eliminated from the scope of the present invention.

As described above in detail, according to the present invention, it is possible to produce a micro three-dimensional structure (micrometer- to nanometer-order outer shape) having a complicated structure.

INDUSTRIAL AVAILABILITY

The present invention is suitable for the field of the production of a micro three-dimensional structure having a complicated structure, and can be applied, for example, to semiconductor manufacturing processes.

What is claimed is:

1. A method of producing a micro three-dimensional structure, characterized by comprising the steps of:
   (a) irradiating a focused ion beam to a sample while supplying a material gas to form a deposit;
   (b) releasing secondary electrons from said deposit hit by ions to allow said secondary electrons to form a terrace on said deposit;
   (c) deflecting the focused ion beam in a desired direction of said terrace based on a set amount from a focal position controlling apparatus;
   (d) forming an overlying deposit at a displaced position on said terrace based on the deflection amount; and
   (e) repeating said steps (b) to (d) in sequence to form a set micro three-dimensional structure.

2. A method of producing a micro three-dimensional structure according to claim 1, characterized in that a beam source is $Ga^+$, $Si^+$, $Si^{++}$, $Be^+$, $Be^{++}$, $Au^+$, or $Au^{++}$ as liquid metal ions, or $H^+$ or $He^+$ as a gas ion source.

3. A method of producing a micro three-dimensional structure according to claim 1, characterized in that said material gas is $WF_6$, $W(CO)_6$, $Mo(CO)_6$, $Fe(CO)_5$, $Ni(CO)_4$, $Au(CH_3)_2(AcAc)$, $Cu(HFAcAc)_2$, or $Al(CH_3)_2$ as an organometallic gas.

4. A method of producing a micro three-dimensional structure according to claim 1, characterized in that said material gas is pyrene ($C_{16}H_{10}$), styrene ($C_8H_{10}$), HMDS, or HMCTS as an organic gas.

5. A device for manufacturing a micro three-dimensional structure, characterized by comprising:
   (a) a sample carried on a temperature variable sample stage;
   (b) a focused ion beam source;
   (c) a gas supply device; and
   (d) a focal position controlling apparatus for a focused ion beam; and
   (e) forming a deposit on said sample by focused ion beam assisted CVD, forming a terrace on said deposit, deflecting a focused ion beam in a desired direction of said terrace based on a set amount sequentially from said focal position controlling apparatus to form an overlying deposit, and forming a set micro three-dimensional structure.

6. A micro three-dimensional structure obtained by the method of producing a micro three-dimensional structure according to claim 1, wherein the micro three-dimensional structure is a coil having an outer shape on an order of several micrometers to nanometers.

7. A micro three-dimensional structure according to claim 6, characterized in that the micro three-dimensional structure is a micro coil having a diameter of 0.6 μm and a wire diameter of 0.08 μm.

8. A micro three-dimensional structure obtained by the method of producing a micro three-dimensional structure according to claim 1, wherein the micro three-dimensional structure is a bellows having an outer shape on an order of several micrometers to nanometers.

9. A micro three-dimensional structure according to claim 8, characterized in that the micro three-dimensional structure is a micro bellows having an outer diameter of 2.75 μm, a height of 6.1 μm, and a thickness of 0.1 μm or more.

10. A micro three-dimensional structure obtained by the method of producing a micro three-dimensional structure according to claim 1, wherein the micro three-dimensional structure is a drill having an outer shape on an order of several micrometers to nanometers.

11. A micro three-dimensional structure according to claim 10, characterized in that the micro three-dimensional structure is a micro drill having an outer diameter of 0.1 μm.

12. A micro three-dimensional structure obtained by the method of producing a micro three-dimensional structure according to claim 1, wherein the micro three-dimensional structure is a wine glass having an outer shape on an order of several micrometers.

13. A micro three-dimensional structure according to claim 12, characterized in that the micro three-dimensional structure is a micro wine glass having an outer diameter of 2.75 μm and a height of approximately 12 μm.

14. A micro three-dimensional structure obtained by the method of producing a micro three-dimensional structure according to claim 1, wherein the micro three-dimensional structure comprises diamond-like carbons made by a $Ga^+$ focused ion beam at an accelerating voltage of 30 kV using pyrene ($C_{16}H_{10}$) as an organic gas.

* * * * *